United States Patent
Chen et al.

(10) Patent No.: US 6,647,607 B2
(45) Date of Patent: Nov. 18, 2003

(54) AUXILIARY TOOL FOR ASSEMBLING A SCRUBBER

(75) Inventors: Hsiu-Chieh Chen, Hsinchu (TW); Hsiao-Ping Hsieh, Hsinchu (TW); Wen-Kan Hu, Hsinchu (TW); Wen-Chin Wu, Hsinchu (TW)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 10/074,953

(22) Filed: Feb. 11, 2002

(65) Prior Publication Data

US 2002/0129487 A1 Sep. 19, 2002

(30) Foreign Application Priority Data

Mar. 19, 2001 (TW) .................... 90204102 U

(51) Int. Cl.[7] .................... B25B 27/14; B25B 1/20
(52) U.S. Cl. .................... 29/281.1; 29/732; 269/40
(58) Field of Search .................... 29/281.1, 464, 29/596, 732, 729; 269/16, 37, 40; 33/645

(56) References Cited

U.S. PATENT DOCUMENTS 5,322,079 A * 6/1994 Fukutomi et al. .......... 134/153

FOREIGN PATENT DOCUMENTS

DE 4024971 * 2/1992

* cited by examiner

Primary Examiner—John C. Hong
(74) Attorney, Agent, or Firm—Townsend and Townsend and Crew LLP

(57) ABSTRACT

The present invention relates to an auxiliary tool for assembling a scrubber which includes a motor, a shaft rotatably coupled to and extending through the motor, a shaft pin detachably connected to the shaft, and a disk coupled to the shaft and having a notch located relative to the shaft pin at a predetermined angle with respect to a longitudinal axis of the shaft when properly assembled. In specific embodiments, the auxiliary tool comprises a tool body configured to at least partially receive the motor, the shaft pin, the disk, and the notch of the disk. The tool body includes a first recess configured to at least partially receive the shaft pin and a protrusion configured to be at least partially received into the notch of the disk. The first recess and the protrusion are arranged at the predetermined angle to position the notch of the disk and the shaft pin of the scrubber for proper assembly at the predetermined angle with respect to the longitudinal axis of the shaft.

12 Claims, 3 Drawing Sheets

AUXILIARY TOOL FOR ASSEMBLING A SCRUBBER

CROSS-REFERENCES TO RELATED APPLICATIONS

This application claims priority from R.O.C. Patent Application No. 090204102, filed Mar. 19, 2001, the entire disclosure of which is incorporated herein by reference.

BACKGROUND OF THE INVENTION

The invention relates to an auxiliary tool for assembling a scrubber; in particular, the invention relates to an auxiliary tool that can readily assemble the scrubber with ease and precision.

In semiconductor processing, a wafer surface is usually required to be cleaned. By means of brush cleaning, spray cleaning, and ultrasonic cleaning, undesired substance remaining on the wafer surface can be eliminated.

Cleaning equipment, such as a scrubber, is shown in FIG. 1a and FIG. 1b. A wafer 1 is placed on wafer support pins 4 of a spin chuck 3 by a robot 2. Each wafer support pin 4 is provided with a stepped portion, as shown in FIG. 1a, to support the wafer 1. The distance between the wafer support pins 4 is large enough for the robot 2 to access. The spin chuck 3 is connected to a shaft 5. A shaft pin 6, as shown in FIG. 1b, is disposed at the shaft 5 and used to position the spin chuck 3 and the shaft 5.

Referring to FIG. 1b, the shaft 5 is disposed inside a motor 7 in a rotatable manner. The motor 7 rotates the spin chuck 3. The other end of the shaft 5 is connected with a disk 8 by means of a fixing or mounting part 10. The disk 8 is provided with a notch 9. A cylinder 11, disposed on unillustrated equipment, abuts the notch 9 to stop the disk 8.

FIG. 2a shows a relationship between the disk 8 and sensors disposed on the surrounding equipment. A sensor 13 is disposed at the edge of the disk 8. A sensor 12, corresponding to the sensor 13, is disposed at the surrounding equipment. The rotation number of the disk 8 is detected by the sensors 12, 13 to determine whether the cleaning process is finished. FIG. 2b is a top view of the spin chuck 3. The wafer 1, shown with a dotted line, is placed on the wafer support pins 4. FIG. 2b also shows a relationship between the robot 2 and the wafer support pins 4 when the robot 2 enters the spin chuck 3.

Part of the scrubber is described as above. Since the motor 7 rotates at high speed over a long period, it is relatively easily damaged and must be replaced. However, replacement of the motor is time-consuming. In addition, when the disk 8 is mounted to the shaft 5 during the replacement of the motor 7, the distance and the angle between the disk 8 and the shaft 5 is extremely limited.

If the distance between disk 8 and the shaft 5 is not precise, the disk 8 can interfere with the sensor 12 of the surrounding equipment, or the motor 7 cannot be assembled into the scrubber. If the angle between disk 8 and the shaft 5 is not precise, the position at which the robot 2 enters the spin chuck 3 may become inaccurate enough that the robot 2 may collide with the wafer support pins 4 of the spin chuck 3. As a result, it may require a significant amount of time to attach the disk 8 to the shaft 5 properly.

BRIEF SUMMARY OF THE INVENTION

In view of the disadvantages of the aforementioned conventional assembly method, the invention provides an auxiliary tool that can readily assemble a scrubber with ease and precision.

An aspect of the present invention is directed to an auxiliary tool for assembling a scrubber which includes a motor, a shaft rotatably coupled to and extending through the motor, a shaft pin detachably connected to the shaft, and a disk coupled to the shaft and having a notch located relative to the shaft pin at a predetermined angle with respect to a longitudinal axis of the shaft when properly assembled. The auxiliary tool comprises a tool body configured to at least partially receive the motor, the shaft pin, the disk, and the notch of the disk. The tool body includes a first recess configured to at least partially receive the shaft pin and a protrusion configured to be at least partially received into the notch of the disk. The first recess and the protrusion are arranged at the predetermined angle to position the notch of the disk and the shaft pin of the scrubber for proper assembly at the predetermined angle with respect to the longitudinal axis of the shaft.

In some embodiments, the tool body comprises a second recess configured to partially receive the motor. The tool body comprises a third recess configured to partially receive a portion of the shaft disposed on a side of the motor opposite from the disk. The first recess may be formed inside the third recess. The tool body comprises a fourth recess configured to partially receive a portion of the shaft disposed on a side of the motor where the disk is disposed. The protrusion is configured to match a shape of the notch and abut the disk. The first recess is configured to partially receive the shaft pin.

Another aspect of the present invention is directed to an auxiliary tool for assembling a scrubber which includes a motor, a shaft rotatably coupled to and extending through the motor, a shaft pin detachably connected to the shaft, and a disk coupled to the shaft and having a notch located relative to the shaft pin at a predetermined angle with respect to a longitudinal axis of the shaft when properly assembled. The auxiliary tool comprises a tool body configured to partially receive the scrubber. The tool body includes a first recess configured to receive the shaft pin. A protrusion is integrally formed on the tool body and is configured to match a shape of the notch and abut the disk. The first recess and the protrusion are arranged at the predetermined angle to position the notch of the disk and the shaft pin of the scrubber for proper assembly at the predetermined angle with respect to the longitudinal axis of the shaft.

Another aspect of the present invention is directed to a method of assembling a scrubber which includes a motor, a shaft rotatably coupled to and extending through the motor, a shaft pin detachably connected to the shaft, and a disk coupled to the shaft and having a notch located relative to the shaft pin at a predetermined angle with respect to a longitudinal axis of the shaft when properly assembled. The method comprises providing a tool body configured to partially receive the scrubber, wherein the tool body includes a first recess and a protrusion. The tool body is placed adjacent the scrubber to at least partially receive the shaft pin into the first recess of the tool body and to at least partially insert the protrusion of the tool body into the notch of the disk. The first recess and the protrusion are arranged at the predetermined angle to position the notch of the disk and the shaft pin of the scrubber for proper assembly at the predetermined angle with respect to the longitudinal axis of the shaft.

In some embodiments, the tool body comprises a second recess, and the tool body is placed adjacent the scrubber to partially receive the motor into the second recess of the tool body. The tool body comprises a third recess, and the tool body is placed adjacent the scrubber to partially receive into the third recess a portion of the shaft disposed on a side of the motor opposite from the disk. The tool body comprises a fourth recess, and the tool body is placed adjacent the scrubber to partially receive into the fourth recess a portion of the shaft disposed on a side of the motor where the disk is disposed. The protrusion of the tool body is configured to match a shape of the notch, and the tool body is placed adjacent the scrubber to abut the disk with the protrusion of the tool body. The tool body is placed adjacent the scrubber to partially receive the shaft pin into the first recess of the tool body.

BRIEF DESCRIPTION OF THE DRAWINGS

FIG. 1b is a schematic perspective view depicting part of the scrubber of FIG. 1a;

FIG. 3b is a front elevational view depicting the auxiliary tool for assembling a scrubber according to an embodiment of FIG. 3a; and FIG. 3c is a side elevational view depicting the auxiliary tool of FIG. 3a.

DETAILED DESCRIPTION OF THE INVENTION

Figure 3A:
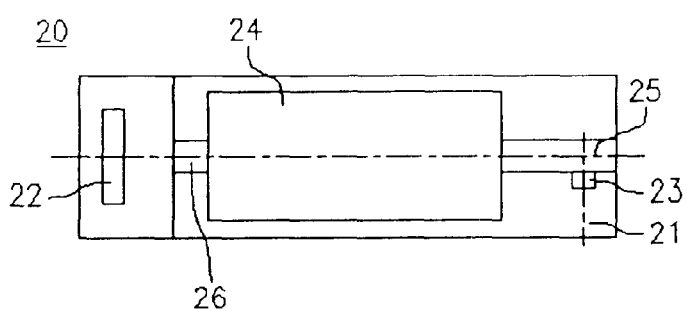
FIG. 3a is a top plain view depicting an auxiliary tool of this invention.
Figure 3B:
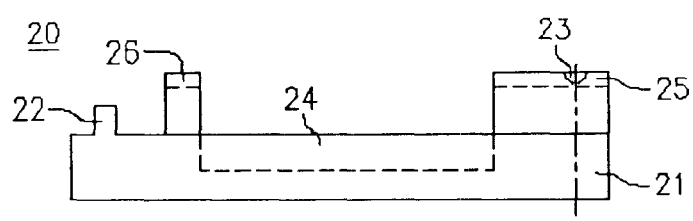
Figure 3C:
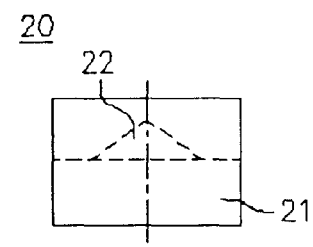

Referring to FIG. 3a, FIG. 3b and FIG. 3c, an auxiliary tool 20 of the present invention is used to assemble a scrubber such as that shown in FIG. 1a, FIG. 1b, FIG. 2a and FIG. 2b. The scrubber, as stated above, is provided with a motor 7, a shaft 5, a shaft pin 6 and a disk 8. The shaft 5 is disposed inside the motor 7 in a rotatable manner, and the shaft pin 6 is detachably disposed at the shaft 5. The disk 8 is provided with a notch 9. A predetermined angle is formed between the shaft pin 6 and the notch 9.

Figure 1A:
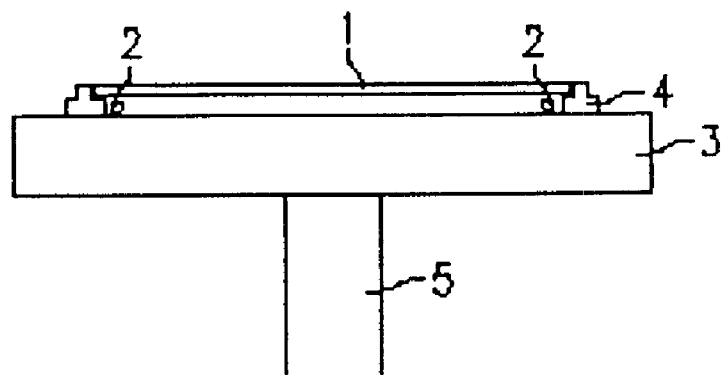
FIG. 1a is a schematic elevational view depicting part of a scrubber.
Figure 1B:
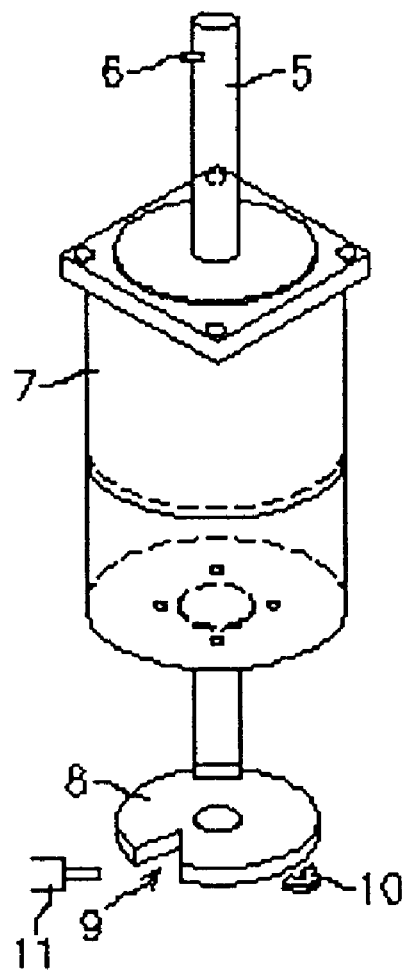
Figure 2A:
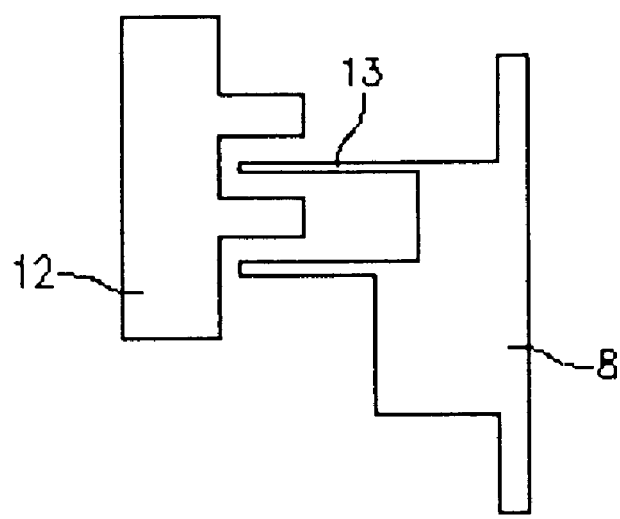
FIG. 2a is a schematic view depicting a relationship between a disk and a sensor of surrounding equipment in the scrubber of FIG. 1b.
Figure 2B:
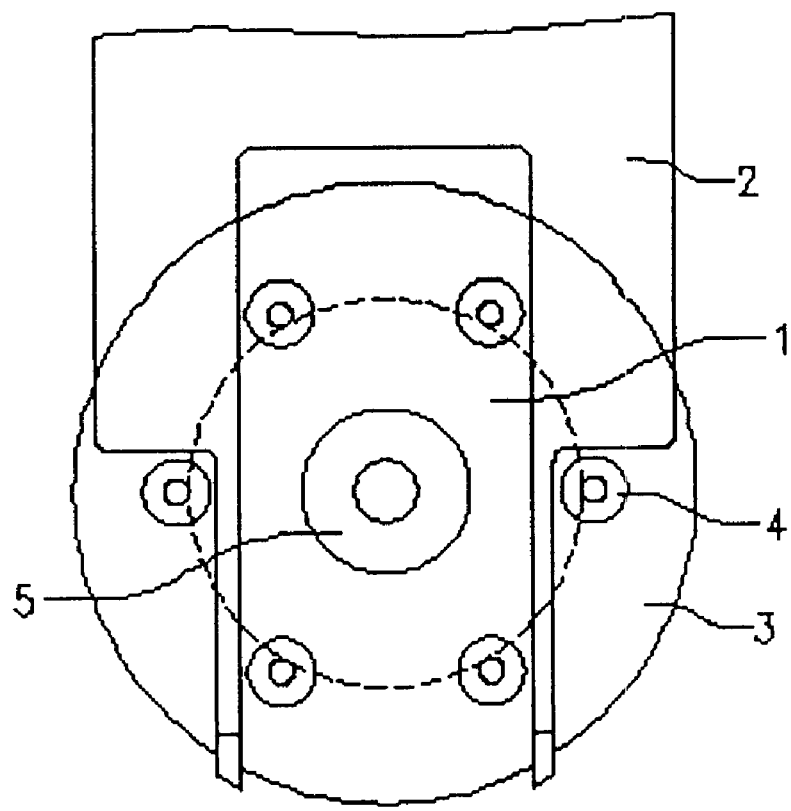
FIG. 2b is a top plain view depicting a spin chuck in the scrubber of FIG. 1b.

The auxiliary tool 20 comprises a tool body 21 and a protrusion 22. The protrusion 22 may be integrally formed with the tool body 21. The tool body 21, receiving the scrubber as shown in FIG. 1b, is provided with a first recess 23, a second recess 24, a third recess 25 and a fourth recess 26. The first recess 23 is used to receive, typically partially, the shaft pin 6. The second recess 24 is used to partially receive the motor 7. The third recess 25 and the fourth recess 26 are disposed on opposite sides of the motor 7 to partially receive the shaft 5.

Furthermore, as shown in FIG. 3a and FIG. 3b, the first recess 23 communicates with the third recess 25, and the longitudinal axis of the first recess 23 is perpendicular to the longitudinal axis of the third recess 25. The first recess 23 may be considered to be formed inside the third recess 25.

The protrusion 22 is arranged on the tool body 21 in a manner that a predetermined angle is formed between the protrusion 22 and the first recess 23 with respect to the longitudinal axis of the shaft. It is noted that the predetermined angle formed between the protrusion 22 and the first recess 23 is the same with the predetermined angle formed between the notch 9 and the shaft pin 6. The shape of the protrusion 22 corresponds to the shape of the notch 9, and is used to abut the disk 8.

According to the auxiliary tool of this invention, when the motor 7 must be replaced, the operator simply places the motor 7 partially inside the auxiliary tool 20. The shaft pin 6 is received into the first recess 23, and the protrusion 22 is received into the notch 9 and abuts the disk 8. After both the distance and the angle between the shaft pin 6 and the notch 9 of the disk 8 are correct, the disk 8 can be fixed onto the shaft 5. Thus, replacement time is highly reduced, and efficiency is increased.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. An auxiliary tool for assembling a scrubber which includes a motor, a shaft rotatably coupled to and extending through the motor, a shaft pin detachably connected to the shaft, and a disk coupled to the shaft and having a notch located relative to the shaft pin at a predetermined angle with respect to a longitudinal axis of the shaft when properly assembled, the auxiliary tool comprising:

a tool body configured to at least partially receive the motor, the shaft pin, the disk, and the notch of the disk, the tool body including a first recess configured to at least partially receive the shaft pin and a protrusion configured to be at least partially received into the notch of the disk, the first recess and the protrusion being arranged at the predetermined angle to position the notch of the disk and the shaft pin of the scrubber for proper assembly at the predetermined angle with respect to the longitudinal axis of the shaft.

2. The auxiliary tool of claim 1 wherein the tool body comprises a second recess configured to partially receive the motor.

3. The auxiliary tool of claim 1 wherein the tool body comprises a third recess configured to partially receive a portion of the shaft disposed on a side of the motor opposite from the disk.

4. The auxiliary tool of claim 3 wherein the first recess is formed inside the third recess.

5. The auxiliary tool of claim 1 wherein the tool body comprises a fourth recess configured to partially receive a portion of the shaft disposed on a side of the motor where the disk is disposed.

6. The auxiliary tool of claim 1 wherein the protrusion is configured to match a shape of the notch and abut the disk.

7. The auxiliary tool of claim 1 wherein the first recess is configured to partially receive the shaft pin.

8. An auxiliary tool for assembling a scrubber which includes a motor, a shaft rotatably coupled to and extending through the motor, a shaft pin detachably connected to the shaft, and a disk coupled to the shaft and having a notch located relative to the shaft pin at a predetermined angle with respect to a longitudinal axis of the shaft when properly assembled, the auxiliary tool comprising:

a tool body configured to partially receive the scrubber, the tool body including a first recess configured to receive the shaft pin;

a protrusion integrally formed on the tool body and being configured to match a shape of the notch and abut the disk, the first recess and the protrusion being arranged at the predetermined angle to position the notch of the disk and the shaft pin of the scrubber for proper assembly at the predetermined angle with respect to the longitudinal axis of the shaft.

9. The auxiliary tool of claim 8 wherein the tool body comprises a second recess configured to partially receive the motor.

10. The auxiliary tool of claim 8 wherein the tool body comprises a third recess configured to partially receive a portion of the shaft disposed on a side of the motor opposite from the disk.

11. The auxiliary tool of claim 10 wherein the first recess is formed inside the third recess.

12. The auxiliary tool of claim 8 wherein the tool body comprises a fourth recess configured to partially receive a portion of the shaft disposed on a side of the motor where the disk is disposed.

\* \* \* \* \*